United States Patent [19]

Takemae et al.

[11] Patent Number: 4,742,486

[45] Date of Patent: May 3, 1988

[54] SEMICONDUCTOR INTEGRATED CIRCUIT HAVING FUNCTION FOR SWITCHING OPERATIONAL MODE OF INTERNAL CIRCUIT

[75] Inventors: Yoshihiro Takemae, Tokyo; Shigeki Nozaki, Kuwana; Masao Nakano, Kawasaki; Kimiaki Sato, Tokyo; Nobumi Kodama, Kawasaki, all of Japan

[73] Assignee: Fujitsu Limited, Kanagawa, Japan

[21] Appl. No.: 861,199

[22] Filed: May 8, 1986

[30] Foreign Application Priority Data

May 11, 1985 [JP] Japan .................................. 60-098890

[51] Int. Cl.⁴ .............................................. G11C 13/00
[52] U.S. Cl. ................................... 365/189; 365/207; 365/230
[58] Field of Search .............. 365/189, 200, 207, 230, 365/240, 241

[56] References Cited

U.S. PATENT DOCUMENTS

4,701,884 10/1987 Aoki et al. ......................... 365/189

Primary Examiner—Terrell W. Fears
Attorney, Agent, or Firm—Armstrong, Nikaido, Marmelstein & Kubovcik

[57] ABSTRACT

In a semiconductor integrated circuit comprising an internal circuit, a device for receiving a chip select signal from the outside, a device for receiving an input signal from the outside, and a voltage detecting circuit for detecting whether or not the potential of the input signal is higher than a reference potential; the voltage detecting circuit comprises a first device for differentially comparing the potential of the input signal with the reference potential and generating an output potential in accordance with the results of the comparison, a second device for detecting a predetermined edge of the chip select signal so as to trigger the first device, and a third device for latching the output potential of the first device to the third device when the first device is triggered by the second device, the internal circuit being switched from a first mode to a second mode, or vice versa, in accordance with the output potential of the third device.

9 Claims, 9 Drawing Sheets

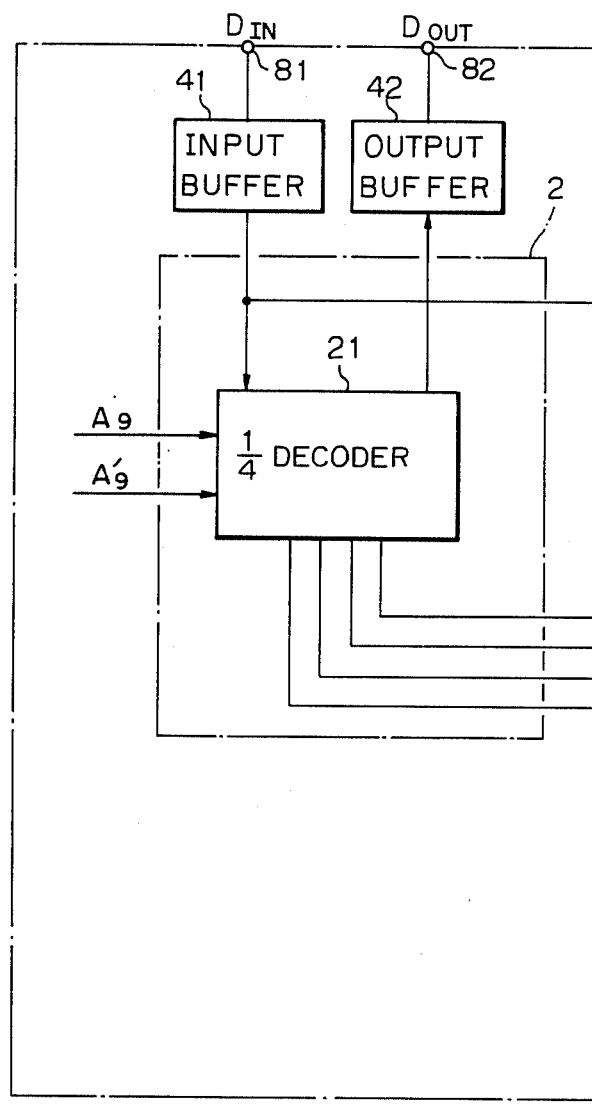

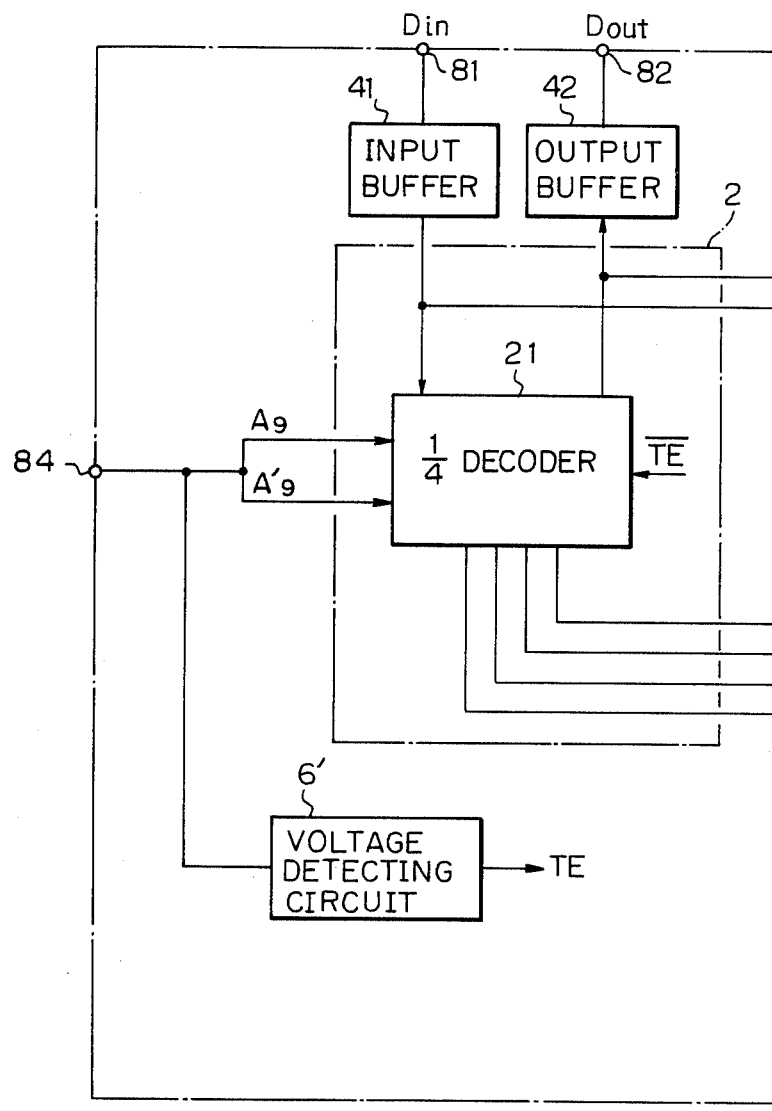

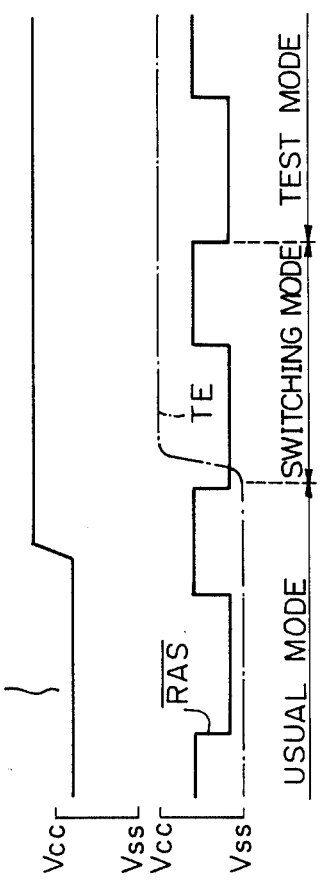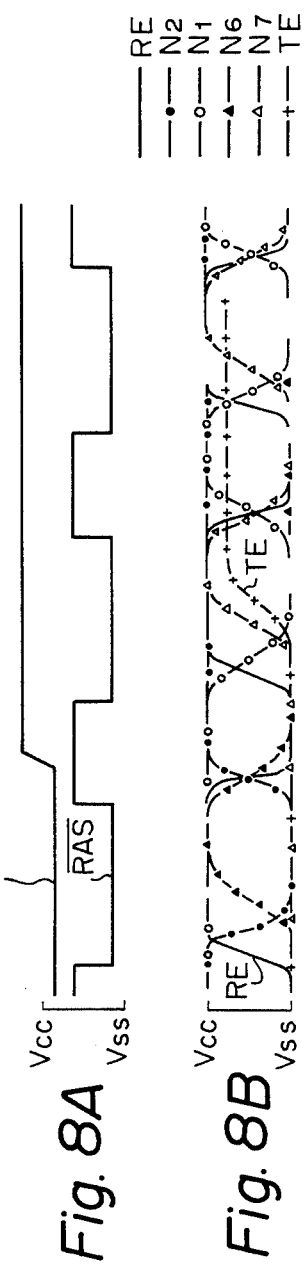

SEMICONDUCTOR INTEGRATED CIRCUIT HAVING FUNCTION FOR SWITCHING OPERATIONAL MODE OF INTERNAL CIRCUIT

BACKGROUND OF THE INVENTION (1) Field of the Invention

The present invention relates to a semiconductor integrated circuit able to switch the operational mode of an internal circuit. More particularly, it relates to a semiconductor integrated circuit comprising a memory cell array which can be switched from a usual (or normal operational) mode to a test mode, or vice versa.

(2) Description of the Related Art

Recently, the capacity of a memory cell array has been increased when a memory cell array having a large capacity (e.g., 1 (mega words)×1 (bit)) is tested, the time needed for successively writing test data to each of the memory cells, and for successively reading test data from each of the memory cells, is increased. For example, if a test of a dynamic RAM having the above capacity and a cycle time of about 260 nano seconds is carried out using a March pattern (a well known test pattern), a test time of about 3.2 seconds is needed for carrying out the above test, and thus, the test time is increased according to the increase of the kinds of tests needed, and further, the cost of carrying out these tests is increased.

Thus, in order to test a memory cell array having a large capacity within a comparatively short time, the memory cell array is divided into several memory blocks, and each memory block is connected to a data input terminal and a data output terminal through a functional block for usual operation, which functions when the memory cell array operates in a usual mode, and a functional block for testing which functions when the memory cell array operates in a test mode. The functional block for a usual operation usually comprises a decoder for selecting one of the memory blocks.

Thus, in a write mode, predetermined write data is written to a predetermined memory cell arranged in the memory block selected by the decoder provided in the functional block for a usual operation. On the other hand, in a read mode, data written in a predetermined memory cell arranged in the memory block selected by the above decoder is output as read data.

Further, when a test for the memory cell array is carried out, the above circuits formed through the functional block for a usual operation are switched to the circuits formed through the functional block for testing, and the test data is simultaneously written to each of the corresponding memory cells arranged in each of the memory blocks, through the functional block for testing. Thus, in a test mode, it is possible to simultaneously carry out a test for all memory blocks within a relatively short time.

In the semiconductor integrated circuit having a construction such as above, it is necessary to provide a terminal for supplying a signal for switching the operational mode of the memory cell array from the outside, e.g., for switching the memory cell array from a usual mode to a test mode, or vice versa.

However, the number of terminals which can be provided in the package receiving the chip of the semiconductor integrated circuit is limited, and therefore, it is difficult to provide an exclusive terminal in the package for receiving the signal for switching the operational mode of the memory cell array from the outside and thus carry out the test for the memory cell array after the chip has been received in the package, especially when the capacity of the memory cell array has been increased.

Accordingly, it has been proposed to supply an input signal from the outside, this input signal having a potential set to a different value in the test mode from that of the input signal supplied in a usual mode, by using an existing terminal provided in the package (e.g., an address terminal connected to the above decoder for selecting one of the memory blocks), and to switch the operational mode of the memory cell array from a usual mode to a test mode, or vice versa, in accordance with an signal output by a voltage detecting circuit which detects the potential of the input signal.

However, in the conventional voltage detecting circuit, as the potential of the input signal is detected by the circuit in which a predetermined number of transistors is connected in series, the shift value due to the variation of the characteristics of each of the series connected transistors may be serially superimposed, and as a result, the correct value of the potential of the input signal cannot be detected. Accordingly, the signal for switching the operational mode of the memory cell array will be incorrectly output, even when each of the above shift values is small.

Therefore, according to the above voltage detecting circuit, a problem arises in that it is necessary to supply the input signal having a comparatively high value potential (e.g., 8 or 9 volts) as the input signal supplied in a test mode, to prevent the above incorrect operation, even when the potential of the input signal is lower than $V_{CC}$ (5 volts), for example, in the usual mode.

Further, in the above conventional circuit, as the input signal is continuously supplied from the outside, the potential of the input signal may often change, due to variations of the power supply potential and noise superimposed on the input signal.

Therefore, another problem arises in that the operational mode switched by the output signal of the voltage detecting circuit becomes unsteady due to the above change of the potential of the input signal. Also, in the above conventional circuit, a predetermined current continuously flows through the circuit during the test mode, for example, and therefore the power consumption tends to increase.

SUMMARY OF THE INVENTION

The present invention intends to solve the above problems, by improving the construction of the above voltage detecting circuit, and the object of the present invention is to precisely detect the potential of the input signal, even when the potential difference of the input signal supplied in each of different operational modes of the internal circuit is within a predetermined value.

Another object of the present invention is to maintain a predetermined operational mode of the internal circuit in a steady state irrespective of variations in the potential of a power supply source and noise superimposed on the input signal.

A further object of the present invention is to cause a decrease in the power consumption of the voltage detecting circuit by preventing the current from continuously flowing through the circuit in a predetermined operational mode (e.g., in a test mode).

To attain these objects, according to the present invention, there is provided a semiconductor integrated circuit comprising an internal circuit; means for receiving a chip select signal from the outside; means for receiving an input signal from the outside; and a voltage detecting circuit for detecting whether or not the potential of the input signal is higher than a reference potential; the voltage detecting circuit comprising a first means for differentially comparing the potential of the input signal with the reference potential and generating a predetermined output potential in accordance with the results of the comparison, a second means for detecting a predetermined edge of the chip select signal so as to trigger the first means, and a third means for latching the output potential of the first means to the third means when the first means is triggered by the second means; the internal circuit being switched from a first mode to a second mode, or vice versa, in accordance with the output potential of the third means. Thus, the voltage detecting circuit according to the present invention is constructed so that it can be dynamically triggered by the predetermined edge of the chip select signal and thus latch the predetermined output potential for switching the operational mode of the internal circuit in accordance with the relative potential difference detected by differentially comparing the potential of the input signal with the reference potential.

Then, according to the present invention, it is possible to precisely detect the potential of the input signal irrespective of a shift in the characteristics of each of the transistors comprising the voltage detecting circuit, by differentially comparing the potential of the input signal with the reference potential and generating a predetermined output potential in accordance with the results of the comparison.

Also, according to the present invention, it is possible to maintain a predetermined operational mode of the internal circuit in a steady state irrespective of variations in the potential of the power supply source and noise superimposed on the input signal, by activating the voltage detecting circuit (namely, by triggering), when the voltage detecting circuit detects the predetermined edge (e.g., the falling edge of the potential) of the chip select signal.

Further, according to the present invention, it is possible to reduce the power consumption by constructing the voltage detecting circuit so as to prevent current from continuously flowing during a predetermined operational mode of the internal circuit (e.g., a test mode).

Even further, according to the present invention, one of several existing terminals such as a data input terminal or a data output terminal may be used as a terminal through which the input signal is supplied, besides the above-mentioned address terminal connected to the decoder provided in the functional block for a usual operation, by supplying the input signal to the data terminal in synchronism with the predetermined edge of the chip select signal.

BRIEF DESCRIPTION OF THE DRAWINGS

FIG. 7A and FIG. 7B are schematic timing diagrams explaining the operation of the voltage detecting circuit shown in FIG. 6; and FIG. 8A and FIG. 8B are detailed timing diagrams regarding the change of the potential at several points in the voltage detecting circuit shown in FIG. 6.

DESCRIPTION OF THE PREFERRED EMBODIMENTS

Figure 1B:
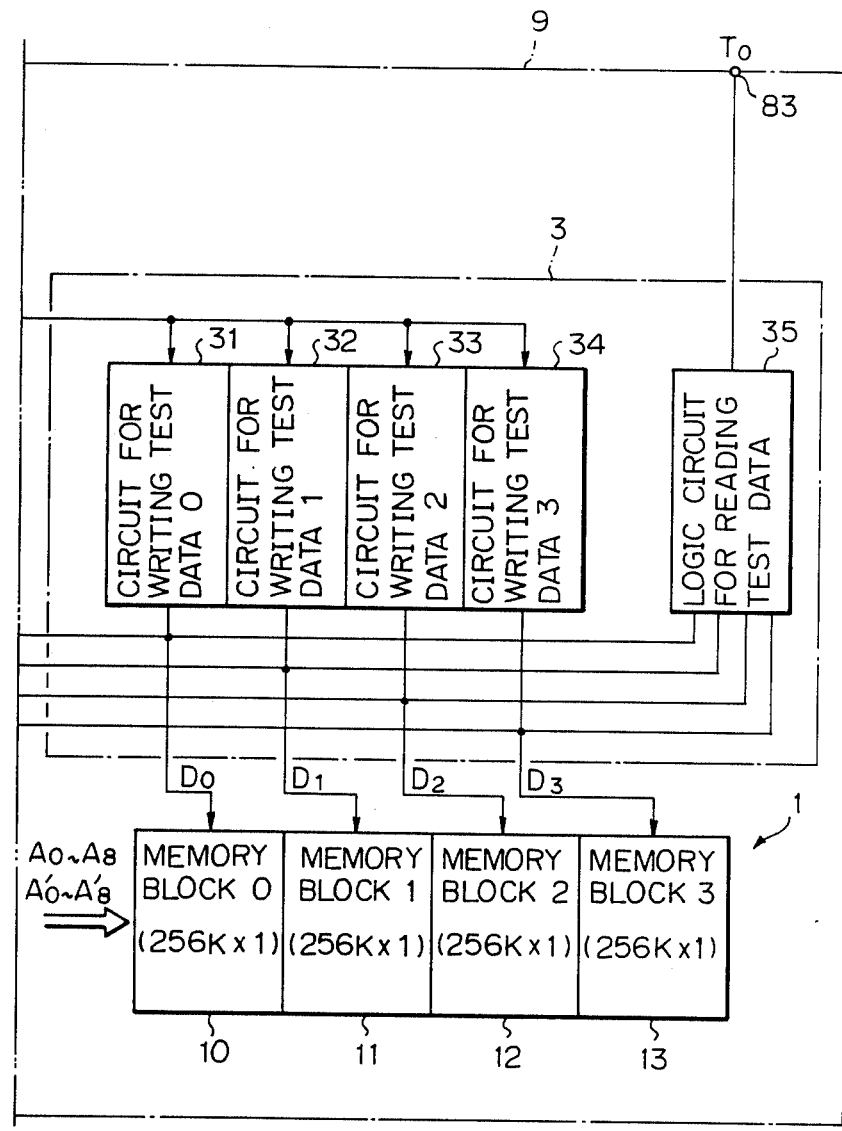
FIG. 1 made up of FIG. 1A and 1B is a block diagram illustrating an example of a conventional semiconductor integrated circuit comprising a memory cell array for which a test can be carried out within a comparatively short time.

To clarify the background of the present invention, an example of a conventional semiconductor integrated circuit comprising a memory cell array having a large capacity, for which a test can be carried out within a comparatively short time, is shown in FIG. 1.

In FIG. 1, reference numeral 1 is a memory cell array having a capacity of (1 mega words)×(1 bit) comprising four memory blocks 10, 11, 12, and 13, and each block has a capacity of (256 kilo words)×(1 bit). Reference numeral 2 is a functional block for usual operation which functions when the memory cell array operates in a usual mode. The functional block 2 usually comprises a ¼ decoder 21 including an address buffer. A row address signal $A_9$ and a column address signal $Ahd\ 9'$ are supplied from the outside to the ¼ decoder 21 through an address terminal 84, and the ¼ decoder selects one of four data buses $D_0$ to $D_3$, which are connected respectively, to four memory blocks 10 to 13 in accordance with the address signals $A_9$ and $A_9'$. Thus, in a write mode, a predetermined write data $D_{IN}$ is written to a predetermined memory cell in the memory block connected to the selected data bus through a data input terminal 81, an input buffer 41, the decoder 21, and the selected data bus. Also, in a read mode, data written in a predetermined memory cell in the memory block connected to the selected data bus is supplied to a data output terminal 82 as read data $D_{OUT}$ through the selected data bus, the decoder 21, and an output buffer 42. In this connection, as is well known, row address signals $A_0$ to $A_8$ and column address signals $A_0'$ to $A_8'$ are supplied to each of the memory blocks 10 to 13 through a decoder (not shown in figures) in order to designate row and column addresses corresponding to a predetermined memory cell arranged in each of the memory blocks 10 to 13, to which the data $D_{IN}$ is written in a write mode, or from which the data $D_{OUT}$ is output in a read mode.

Although the semiconductor integrated circuit shown in FIG. 1 operates as above-mentioned in a usual mode, when a test for the memory cell array 1 is carried out, the circuits formed between the input buffer 41 or the output buffer 42 and each of the memory blocks 10 to 13 are switched from the above circuits formed through the functional block 2 for usual operation to the other circuits formed through the functional block 3 for testing, as described below. In this connection, reference numeral 9 is a chip, and the above memory cell array 1, the functional block 2 for usual operation, and the functional block 3 for testing are arranged on the chip 9.

The functional block 3 for testing comprises four circuits 31, 32, 33, and 34 for writing test data to each of the memory blocks 10 to 13, and a logic circuit 35 for logically reading test data output from each of the memory blocks 10 to 13. Each of the circuits 31 to 34 amplifies test data input from the input buffer 41, and then supplies the test data to each of the corresponding memory cells arranged in each of the memory blocks 10 to 13 by designating the row address signals $A_0$ to $A_8$ and the column address signals $A_0'$ a $A_8'$ supplied to each of the memory blocks. Thus, in a test mode, it is possible to simultaneously test the four memory blocks 10 to 13 by using the above functional block 3 for testing.

The operation of the whole circuit in a test mode will be now explained in more detail. When the test for the memory cell array is carried out, test data input through the data input terminal 81 and the input buffer 41 is simultaneously supplied to each of the memory blocks 10 to 13 through each of the circuits 31 to 34, and the test data is simultaneously written to each of the corresponding memory cells (in this case, four memory cells) arranged in each of the memory blocks 10 to 13. Then, the test data written in each of the corresponding memory cells arranged in each of the memory blocks 10 to 13 is supplied to the logic circuit 35, which detects whether or not the voltage levels of the test data (in this case, four sets of data) supplied from each of the corresponding memory cells arranged in each of the memory blocks 10 to 13 all coincide. Thus, the logic circuit 35 outputs a predetermined signal $T_0$ to a test terminal 83 only when the logic circuit 35 detects that the voltage levels of the above four data all coincide, namely, all of the above corresponding memory cells are normal. In this way, all of the corresponding memory cells arranged in each of the memory blocks 10 to 13 are successively tested to determine whether the above memory cells are normal or defective. According to the above construction, as the corresponding memory cells (in this case, four memory cells) arranged in each of the memory blocks are simultaneously tested in the test mode, it is possible to shorten the test time (in this case, to shorten to one fourth) compared with the case wherein each of the above corresponding memory cells are tested one by one at different times. In this connection, in such a memory cell array, as it is divided into several memory blocks, it is possible to provide a different function to each of the memory blocks 10 to 13 when these memory blocks are operated in a usual mode.

Figure 2B:
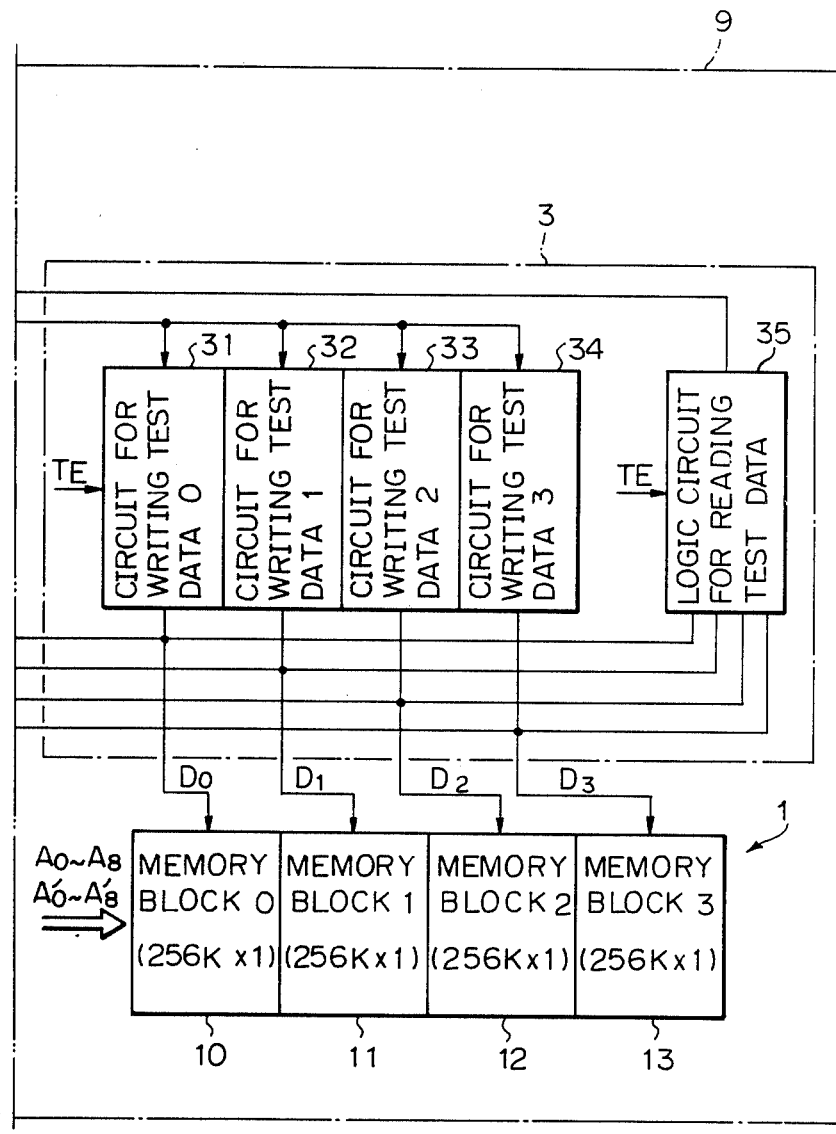
FIG. 2 made up of FIG. 2A and 2B is a block diagram illustrating another example of a conventional semiconductor integrated circuit of that kind.

Another improved example of the conventional semiconductor integrated circuit of this kind is shown in FIG. 2. In FIG. 2, members identical to those of FIG. 1 are represented by the same reference numerals or characters (as in all later figures).

The difference between the circuits shown in FIG. 1 and FIG. 2 is that the circuit shown in FIG. 2 is constructed so that the output side of the logic circuit 35 is connected to the output buffer 42, and thus the test for each of the above corresponding memory cells is carried out in accordance with the signal $D_{OUT}$ output from the data output terminal 82 through the logic circuit 35 and the output buffer 42, when the test data written in each of the above corresponding memory cells is supplied from each of the memory blocks 10 to 13 to the logic circuit 35 in the test mode.

Figure 3:
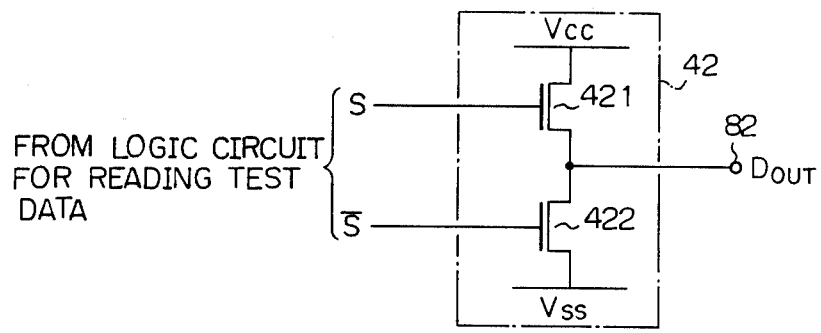
FIG. 3 shows an example of a circuit diagram of an output buffer shown in FIG. 2.

In this case, the output buffer 42 comprises a pair of transistors 421 and 422, as shown in FIG. 3, for example, and the signals S and $\bar{S}$ output from the logic circuit 35 are input to gates of the pair of transistors 421 and 422, respectively.

Thus, when the voltage levels of the data (in this case, four sets of data) written in each of the corresponding memory cells arranged in each of the memory blocks are all high, the voltage levels of the above signals S and $\bar{S}$ output from the logic circuit 35 become high level and low level, respectively. As a result, in the output buffer 42, the transistor 421 turns ON and the transistor 422 turns OFF, and therefore, the signal $D_{OUT}$ having a high voltage level is output from the output buffer 42 to the terminal 82. Contrary to this, when the voltage levels of the above data are all low, the voltage levels of the above signals S and $\bar{S}$ become low level and high level, respectively. As a result, the transistor 421 turns OFF and the transistor 422 turns ON, and therefore, the signal $D_{OUT}$ having a low voltage level is output from the output buffer 42 to the terminal 82.

Also, if at least one of the above corresponding memory cells is defective, the data supplied from each of the corresponding memory cells arranged in each of the memory blocks 10 to 13 to the logic circuit 35 do not coincide. Thus, the voltage levels of both of the above signals S and $\bar{S}$ become low level, and as a result, both transistors 421 and 422 turn OFF. Accordingly, the output buffer 42 does not generate a predetermined output signal, and therefore, it is possible to detect whether the defective memory cell exists in each of the above corresponding memory cells. In this way, according to the circuit shown in FIG. 2, it is possible to output the signal for detecting the results of the test in a test mode through the terminal 82 which functions as the data output terminal in a usual mode.

In such a semiconductor integrated circuit, it is necessary to provide a terminal through which a signal for switching the operational mode of the internal circuit is supplied from the outside, in order to switch the memory cell array from a usual mode to a test mode, or vice versa. Namely, from the circuit formed through the functional block 2 for usual operation to the circuit formed through the functional block 3 for testing, or vice versa.

However, the number of terminals (pins) which can be provided in the package receiving the chip of the semiconductor integrated circuit comprising the memory cell array is limited to a predetermined number, and therefore, it is difficult to provide an exclusive terminal in the package to which the above signal for switching the operational mode of the memory cell array can be supplied from the outside, in addition to the existing terminals, in order to carry out the test for the memory cell array after the chip has been received in the package, especially when the capacity of the memory cell array becomes large.

Therefore, it has been proposed to supply an input signal from the outside, the potential of which is set to a different value in the test mode from that of the input signal supplied in a usual mode, through the existing terminal provided in the package (e.g., the address terminal 84 connected to the decoder 21), and to switch the operational mode of the memory cell array from the usual mode to the test mode (namely, from the circuit formed through the functional block 2 to the circuit formed through the functional block 3), or vice versa, in accordance with an output signal TE of a voltage detecting circuit 6', which detects the potential of the input signal supplied through the terminal 84, as shown in FIG. 2.

Figure 4:
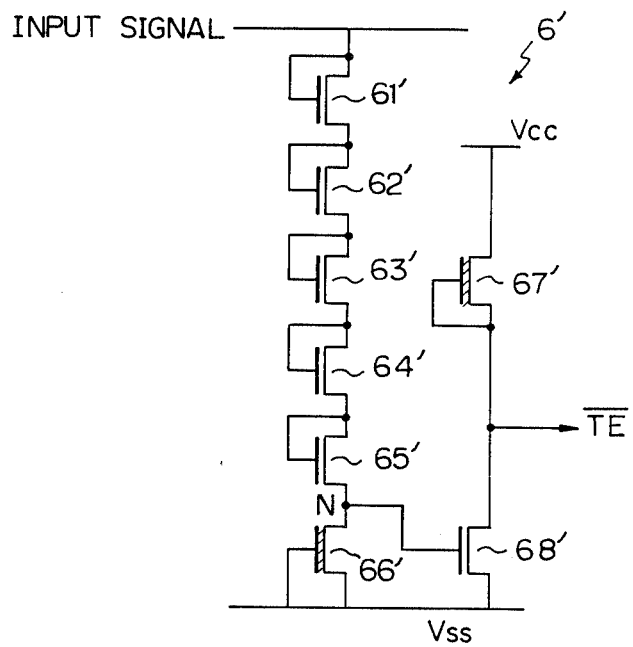
FIG. 4 shows an example of a conventional voltage detecting circuit used in FIG. 2.

In this connection, FIG. 4 shows an example of a conventional voltage detecting circuit 6' used for detecting the potential of the above input signal and switching the operational mode of the internal circuit.

In FIG. 4, reference numerals 61' to 65' and 68' show an enhancement type transistor, respectively, and reference numerals 66' and 67' show a depletion type transistor, respectively. When the input signal having the predetermined potential is supplied from the above terminal 84 to the voltage detecting circuit 6' and the transistors 61' to 65' provided in the circuit 6' in series, each of which transistors has a gate and a drain connected in common, turn ON, a predetermined potential drop (e.g., 1 volt, for example) is generated between a gate and a source of each of the transistors 61' to 65'. Thus, if the potential of the input signal is set to, for example, 6 volts, in the test mode, the potential of the connecting point N between the transistors 65' and 66' becomes 1 volt due to the sum of the above potential drops generated in each of the above transistors 61' to 65', and thus the transistor 68', having a gate connected to the above point N turns ON, and the potential of the output signal $\overline{TE}$ of the circuit 6' becomes low. Contrary to this, if the potential of the input signal is, for example, 5 volts, the potential of the connecting point N becomes 0 volt, and thus the transistor 68' turns OFF and the potential of the output signal $\overline{TE}$ of the circuit 6' becomes high. Thus, the circuit 6' generates the output signal $\overline{TE}$ for switching the operational mode of the internal circuit from the test mode to the usual mode, for example, in accordance with the potential of the input signal.

However, as the above circuit 6' is constructed so as to detect the potential of the input signal by connecting the predetermined number of transistors 61' to 65' in series, the shift value due to variations of the characteristics of each of the transistors 61' to 65' may be serially added, and as a result, the potential of the input signal (accordingly, the potential of the connecting point N) is incorrectly detected, and thus the above output signal $\overline{TE}$ is incorrectly generated, even when the above shift values are small.

Therefore, according to the above circuit 6', a problem arises in that it is necessary to set the potential of the input signal to relatively high value (8 or 9 volts, for example) in the test mode, in order to prevent the above incorrect operation.

Further, in the above circuit 6', as the input signal is continuously supplied through the terminal 84 to the circuit 6', the potential of the input signal may often vary due to the variation of the potential of the power supply source and the noise superimposed on the input signal.

Therefore, another problem arises in that the operational mode switched by the output signal $\overline{TE}$ of the circuit 6' becomes unsteady due to the above variation of the potential of the input signal. Also, in the above circuit 6', a predetermined current always flows through the circuit during the test mode, for example, and therefore the power consumption tends to increase.

The present invention has been attained in order to solve the above problems.

Figure 5A:
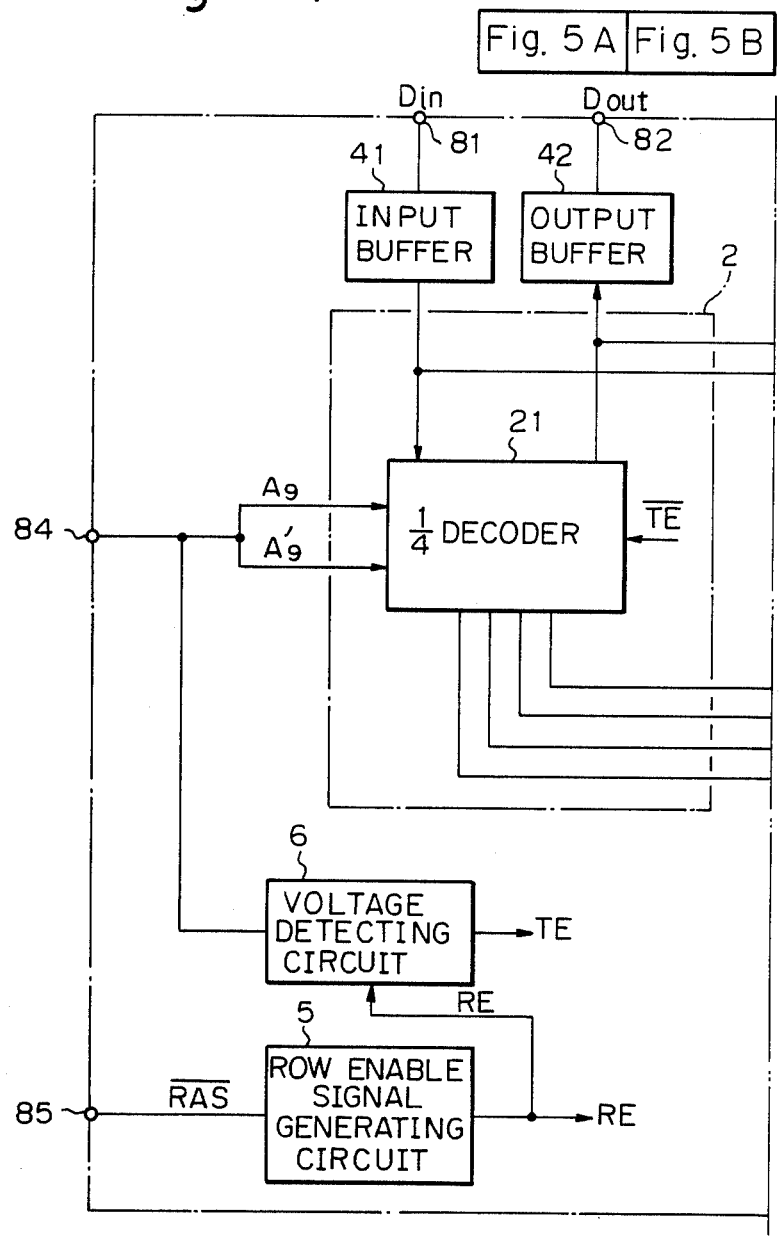
FIG. 5 made up of 5A and 5B is a block diagram illustrating one embodiment of the semiconductor integrated circuit according to the present invention.
Figure 5B:
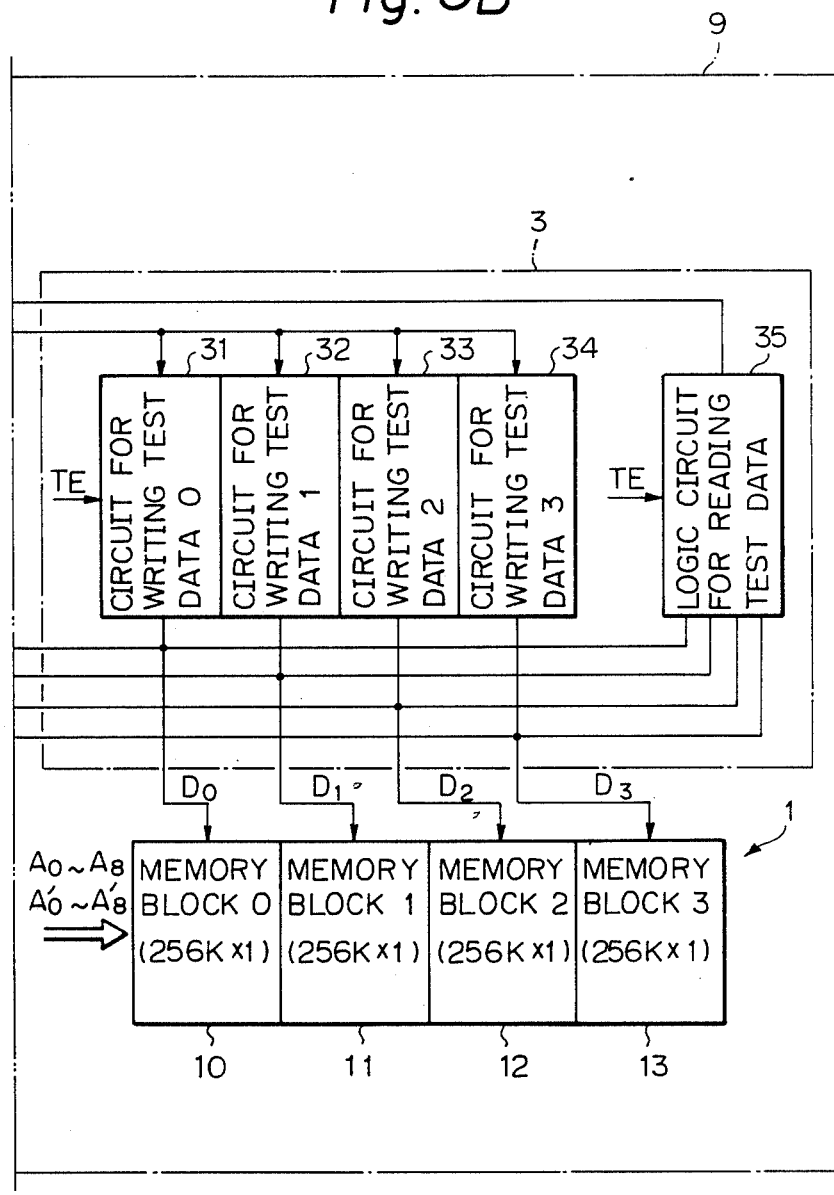

FIG. 5 is a block diagram of one embodiment of the semiconductor integrated circuit according to the present invention.

As shown in FIG. 5, the semiconductor integrated circuit according to the present invention comprises the voltage detecting circuit 6. A row address strobe signal $\overline{RAS}$ is supplied from the outside to a row enable signal generating circuit 5 through a terminal 85, and a row enable signal RE is output from the circuit 5. The row enable signal RE is supplied to the voltage detecting circuit 6 and several other internal circuits.

The row address strobe signal $\overline{RAS}$ is used not only as a timing control signal for entering external address signals but also as a chip select signal for controlling and defining an active period of the device, as is well known in the art. The row enable signal RE is used to activate various internal circuits, accordingly.

When the potential of the signal RE changes from low level to high level, (namely, when the chip 9 is selected), the voltage detecting circuit 6 is triggered so as to be able to detect the potential of the input signal supplied from the outside through the terminal 84, and when the circuit 6 detects that the potential of the input signal is set to a predetermined different value from that of the input signal supplied in the usual mode, the circuit 6 generates the output signal TE for switching the operational mode of the memory cell array 1, and the memory cell array 1 is switched from the usual mode to a test mode, or vice versa, in accordance with the potential of the output signal TE.

The circuit 5 converts the voltage level of the row address strobe signal $\overline{RAS}$ supplied from the outside through the terminal 85 at a TTL level (namely, having a predetermined low level lower than 0.8 volts, and having a predetermined high level higher than 2.4 volts) to the voltage level for operating MOS transistors, and thereby, the potential of the row enable signal RE obtained from the outside of the circuit 5 becomes $V_{CC}$ (5 volts, for example) and $V_{SS}$ (0 volt, for example), when the voltage level of the row address strobe signal $\overline{RAS}$ is low and high, respectively. Then, the row enable signal RE obtained as above-mentioned is supplied to several internal circuits besides the voltage detecting circuit 6 in order to operate the memory cell array 1 (address buffer, for example), and the operation for writing data to a predetermined memory cell or for reading data from a predetermined memory cell is performed every time the voltage level of the row enable signal RE becomes high.

Also, the address terminal 84 connected to the decoder 21, for example, is used as the terminal through which the input signal is supplied to the voltage detecting circuit 6. Thus, the address terminal 84 supplies the row and column address signals $A_9$ and $A_9'$ to the decoder 21 when the memory cell array 1 is in the usual mode, and the terminal 84 is also used as the terminal through which the input signal having the different potential value from that of the address signals $A_9$ and $A_9'$ is supplied in the test mode.

Figure 6:
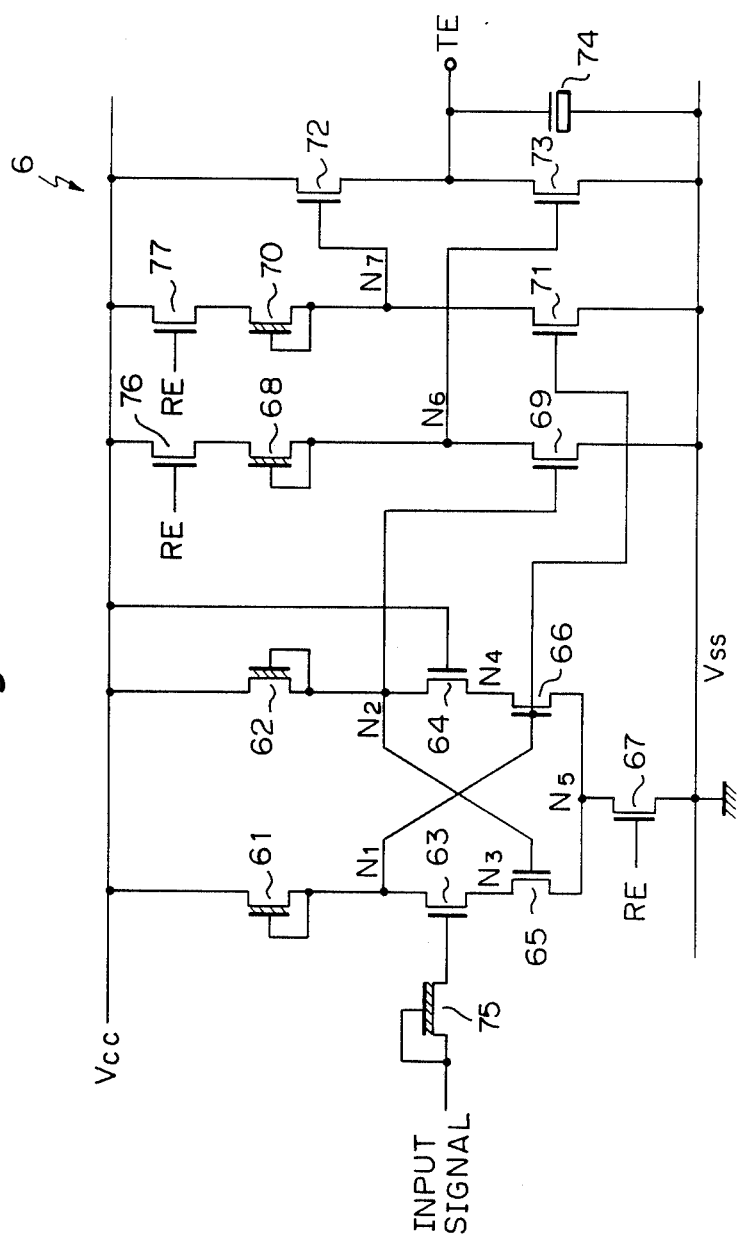
FIG. 6 shows an example of a voltage detecting circuit used in FIG. 5.

FIG. 6 shows a detailed example of the voltage detecting circuit 6 used in the semiconductor integrated circuit shown in FIG. 5. In FIG. 6, reference numerals 61, 62, 68, 70, and 75 denote a depletion type transistor shown by adding oblique lines under a gate connected to a drain in common, reference numerals 63, 64, 65, 66, 67, 69, 71, 72, and 73 denote an enhancement type transistor, and reference numeral 74 denotes a MOS capacitor.

The input signal supplied from the terminal 84 is applied to a gate of the transistor 63 through the transistor 75 having a gate and a drain connected in common. A potential $V_{CC}$ supplied through a power source line is applied to a gate of the transistor 64. Thus, the circuit 6 is constructed so as to differentially compare the potential of the input signal with the potential $V_{CC}$ (5 volts, for example), by using the pair of above transistors 63 and 64. In this connection, the threshold voltage Vth of the transistor 63 can be set to a value different from that of the transistor 64, in order to regulate a reference potential to be compared with the potential of the input signal. Further, in this embodiment, as the input signal is supplied to the gate of the transistor 63 through the transistor 75, the circuit 6 differentially compares the potential of the input signal with a higher potential than the potential $V_{CC}$. Also, the potential of the input signal can be compared with a lower potential than the potential $V_{CC}$ by supplying the potential $V_{CC}$ to the gate of the transistor 64 through a transistor having a gate and a drain connected in common (not shown in FIG. 6). A gate of the transistor 65 is connected to a connecting point $N_2$ between the transistors 62 and 64, and a gate of the transistor 66 is connected to a connecting point $N_I$ between the transistors 61 and 63, to construct a flip-flop circuit. Also, the row enable signal RE is supplied through a gate of the transistor 67.

When the potential of the row address strobe signal $\overline{RAS}$ supplied from the outside through the terminal 85 changes from high level to low level (namely, the potential of the row enable signal RE changes from low level to high level), the transistor 67 turns ON, and the circuit 6 is triggered and brought to the active state, to detect the results of the comparison between the potential of the input signal and the reference potential (namely, the potential $V_{CC}$).

At that time, if the potential of the input signal is a predetermined level set in the usual mode (the level is usually equal to the above-mentioned TTL level and usually lower than the $V_{CC}$ level, as shown in FIG. 7A), the value of the current flowing through the transistor 64 becomes larger than that flowing through the transistor 63, and thus the potential of the connecting point $N_I$ between the transistors 61 and 63 rises and the potential of the connecting point $N_2$ between the transistors 62 and 64 falls. As a result, the transistor 66 having a gate connected to point $N_I$ turns ON, and the transistor 65 having a gate connected to point $N_2$ turns OFF.

Further, as the potential of point $N_I$ is also supplied to a gate of the transistor 71, the transistor 71 turns ON and the transistor 72 turns OFF in accordance with the low level of point $N_7$. On the other hand, as the potential of point $N_2$ is also supplied to a gate of the transistor 69, the transistor 69 turns OFF and the transistor 73 turns ON in accordance with the high level of point $N_6$. As a result the potential of the output signal TE obtained from the connecting point between the transistors 72 and 73 becomes low (namely, $V_{SS}$ level), as shown in FIG. 7B.

Next, although the potential of the row address strobe signal $\overline{RAS}$ changes from low level to high level (namely, the level of the row enable signal RE changes from high level to low level), and the transistor 67 turns OFF, and thus the circuit 6 is brought to the inactive state in which it is not able to detect the potential of the input signal, the potential of the output signal TE is latched in the above low level, as shown in the period of the usual mode in FIG. 7B.

Next, when the potential of the signal $\overline{RAS}$ changes from high level to low level (namely, the potential of the signal RE changes from low level to high level) and the transistor 67 turns ON again, if the potential of the input signal is a predetermined value set in the test mode (6 volts or 7 volts, for example, which is a predetermined level higher than the $V_{CC}$ level, as shown in FIG. 7A), the value of the current flowing through the transistor 63 becomes larger than that flowing through the transistor 64. Thus, the potential of the point $N_I$ falls and the potential of the point $N_2$ rises, and therefore, the transistor 65 turns ON and the transistor 66 turns OFF.

Accordingly, the transistor 69 turns ON and the transistor 73 turns OFF, but on the other hand, the transistor 71 turns OFF and the transistor 72 turns ON, and as a result, the potential of the output signal TE becomes high (namely, nearly equal to $V_{CC}$ level), as shown in FIG. 7B. Thus, the operational mode of the memory cell array 1 is switched from the usual mode to the test mode (namely, from the circuit formed through the functional block 2 for a usual operation to the circuit formed through the functional block 3 for testing), as shown in the switching mode period in FIG. 7B. Also, the MOS capacitor 74 is charged by the high potential of the output signal TE.

Thus, after that time, although the potential of the signal $\overline{RAS}$ becomes high (namely, the potential of the signal RE becomes low), the potential of the output signal TE is maintained at a high level, and next, when the potential of the signal $\overline{RAS}$ changes from high level to low level (namely, when the potential of the signal RE changes from low level to high level), the operational mode of the memory cell array is shifted to the test mode, as shown in the test mode period in FIG. 7B.

Although the potential of the signal $\overline{RAS}$ cyclically changes from low level to high level, the potential of the output signal TE is latched in the above high level, as long as the potential of the input signal maintains the above value set in the test mode.

Thus, as long as the potential of the input signal maintains the value set in the test mode, test data is simultaneously written or simultaneously read, to or from each of the corresponding memory cells provided in the memory blocks 10 to 13, each time the potential of the signal $\overline{RAS}$ becomes low (namely, the potential of the signal RE becomes high), and the memory cell array becomes active.

In this connection, in the above circuit 6, as the signal RE is supplied to each gate of the transistors 67, 76 and 77, no current flows through the circuit 6 even in the test mode when the potential of the signal RE is low and the memory cell array is inactive.

FIG. 8A and FIG. 8B show the operation of the above circuit 6 in more detail. Namely, FIG. 8B shows (by using six different lines) how each potential of the connecting points $N_I$, $N_2$, $N_6$, and $N_7$ and the signals RE and TE changes when the potentials of the input signal and the signal $\overline{RAS}$ change as shown in FIG. 8A.

Although, in the above description, the case wherein the operational mode of the memory cell array is switched from a usual mode to a test mode is exemplified, it is also possible to switch the operational mode from the test mode to the usual mode in accordance with the change of the potential of the input signal by triggering the voltage detecting circuit 6 when the potential of the signal $\overline{RAS}$ changes from high level to low level.

Also, in the above embodiment, although the input signal is supplied from the outside to the voltage detecting circuit 6 through the address terminal 84 connected to the decoder 21 provided in the functional block 2 for usual operation, other terminals such as data input terminal 81 or data output terminal 82 also may be used as the terminal for supplying the input signal, by intermittently supplying the input signal in synchronism with the predetermined edge (the falling edge of the potential, for example) of the signal $\overline{RAS}$.

As described above, according to the present invention, it is possible to precisely detect the predetermined change of the potential of the input signal irrespective of the shift of the characteristics of each of the transistors comprising the voltage detecting circuit 6.

Also, according to the present invention, it is possible to maintain a predetermined operational mode of the internal circuit (the memory cell array, for example) in a steady state irrespective of the variation of the potential of the power supply source or the noise superimposed on the input signal.

Further, according to the present invention, it is possible to construct the voltage detecting circuit 6 so as to reduce the power consumption by preventing the current from continuously flowing during a predetermined operational mode (test mode, for example) by using the transistors 67, 76, and 77 to which the row enable signal RE, for example, is supplied through each gate thereof.

We claim:

1. A semiconductor integrated circuit comprising:
    an internal circuit;
    means for receiving an externally generated chip select signal;
    means for receiving an externally generated input signal; and
    a voltage detecting circuit for detecting whether or not the potential of said input signal is higher than a predetermined reference potential, said voltage detecting circuit comprising:
       a first means for differentially comparing the potential of said input signal with said predetermined reference potential and generating a predetermined output potential in accordance with the results of the comparison,
       a second means for detecting a predetermined edge of said chip select signal so as to trigger said first means, and
       a third means for latching said output potential of said first means to said third means when said first means is triggered by said second means;
    said internal circuit being switched from a first mode of operation to a second mode of operation, or vice versa, in accordance with the output potential of said third means.

2. A semiconductor integrated circuit according to claim 1, wherein said first mode of operation is a normal mode for operating said internal circuit.

3. A semiconductor integrated circuit according to claim 1, wherein said second mode of operation is a test mode for testing said internal circuit.

4. A semiconductor integrated circuit according to claim 1, wherein the potential of said input signal is higher than said predetermined reference potential in a test mode.

5. A semiconductor integrated circuit according to claim 1, wherein the potential of said input signal is lower than said predetermined reference potential in a normal mode of operation.

6. A semiconductor integrated circuit according to claim 1, wherein said predetermined reference potential is obtained from a power source line connected to said voltage detecting circuit.

7. A semiconductor integrated circuit according to claim 1, wherein said externally generated chip select signal is also used as a row enable signal.

8. A semiconductor integrated circuit according to claim 1, further comprising a predetermined number of address terminals for said internal circuit, wherein said internal circuit comprises a decoder for selecting one of a plurality of memory blocks in said internal circuit in a normal mode of operation and said externally generated input signal is supplied to an address terminal connected to said decoder.

9. A semiconductor integrated circuit according to claim 1, further comprising a data input terminal and a data output terminal for said internal circuit, wherein said externally generated input signal is supplied to one of said data input terminal and data output terminal in synchronism with the predetermined edge of said externally generated chip select signal.

* * * * *